United States Patent [19]
Miyazaki

[11] Patent Number: 5,903,582
[45] Date of Patent: *May 11, 1999

[54] MEMORY CIRCUIT

[75] Inventor: Jyunzo Miyazaki, Nagasaki, Japan

[73] Assignee: Sony Corporation, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/588,237

[22] Filed: Jan. 18, 1996

[30] Foreign Application Priority Data

Jan. 25, 1995 [JP] Japan ................................ P07-027755

[51] Int. Cl.⁶ .................................................. G06F 11/00
[52] U.S. Cl. ......................... 371/49.1; 371/21.1; 365/201
[58] Field of Search ................................. 371/21.1, 21.2,
371/49.1, 48, 37.1, 40.1, 67.1, 68.1, 68.2,
37.01, 40.11, 40.12, 40.13, 49.2, 51.1; 395/183.18,
185.07; 364/265, 266.3, 944.92, 945.6;
365/201, 200, 220, 221

[56] References Cited

U.S. PATENT DOCUMENTS

| | | | |
|---|---|---|---|
| 4,345,328 | 8/1982 | White | 371/38 |
| 4,726,021 | 2/1988 | Horiguchi et al. | 379/40.1 |
| 4,740,971 | 4/1988 | Tam et al. | 371/21 |
| 4,958,352 | 9/1990 | Noguchi et al. | 371/40.1 |
| 5,056,089 | 10/1991 | Furuta | 371/3 |
| 5,079,747 | 1/1992 | Nakada | 365/201 |
| 5,140,597 | 8/1992 | Araki | 371/51.1 |
| 5,218,691 | 6/1993 | Tuma et al. | 395/500 |
| 5,448,578 | 9/1995 | Kim | 371/40.1 |

*Primary Examiner*—Trinh L. Tu
*Attorney, Agent, or Firm*—Rader, Fishman & Grauer; Ronald P. Kananen

[57] ABSTRACT

In a semiconductor memory having a configuration of a plurality of bits, there are provided a parity calculation circuit and a test input-output circuit, wherein the test input-output circuit is operated during a pellet checking operation, outputs the test data inputted from a test input-output terminal to data buses while being divided into a plurality of bits constituting one unit during the writing operation, and then the same test data is written into the memory cell of a plurality of bits at the specified address. During the reading operation, a parity calculation circuit performs the parity calculation with all the readout data of a plurality of bits constituting one unit to generate the parity bit and the test input-output circuit outputs the parity bit from the test input-output terminal. The memory tester determines whether the value of the parity bit coincides with the expected output value, thereby the number of concurrent measurements in the pellet checking in the memory can be increased and the measuring cost is reduced.

10 Claims, 5 Drawing Sheets

FIG. I
(RELATED ART)

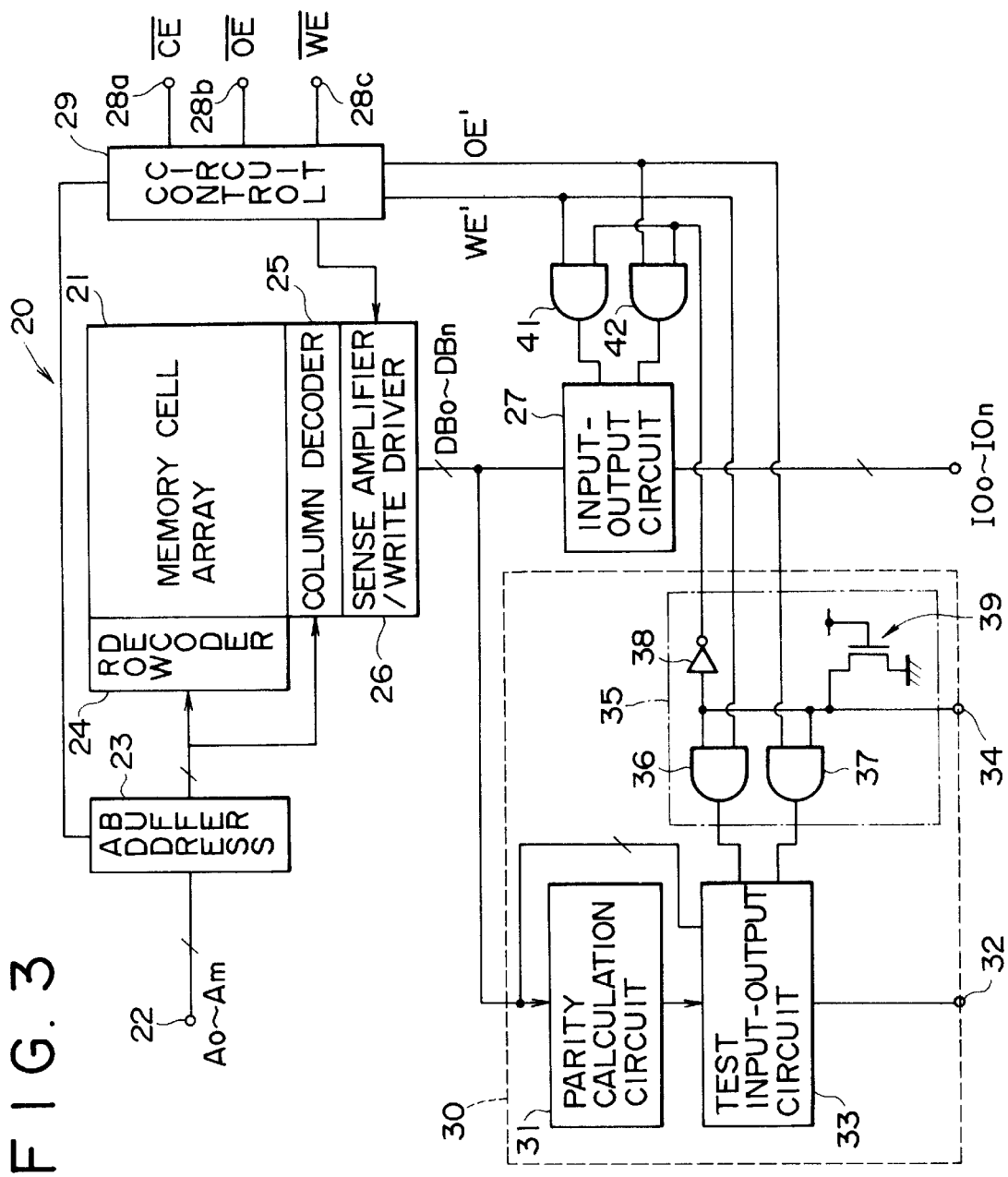
F I G. 3

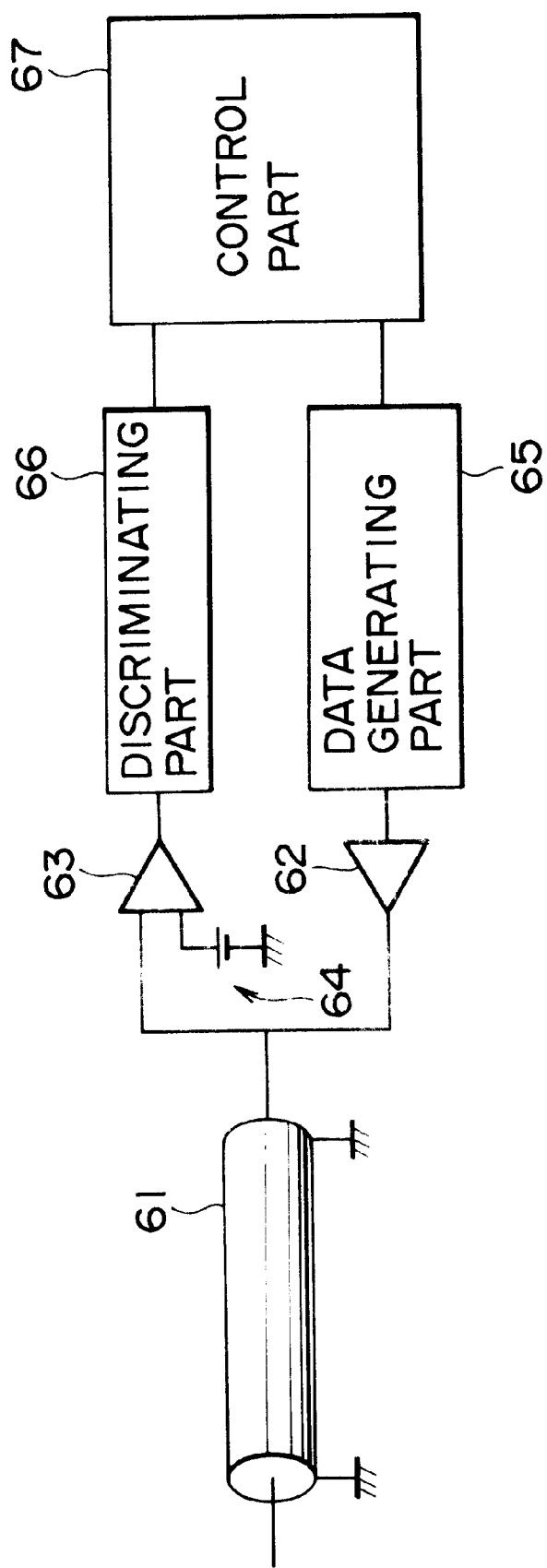

MEMORY CIRCUIT

BACKGROUND OF THE INVENTION

1. Field of the Invention

This invention relates to a memory having a configuration of a plurality of bits.

2. Description of Related Art

A pellet check which is a test performed under a wafer state of a semiconductor memory. This test is performed for each of a chips on the wafer by executing a writing operation and a reading operation for data by using a memory tester in the same manner as that of an actual operation.

FIG. 1 is a top plan view for showing one chip of the semiconductor memory comprised of a plurality of bits in the related art. The memory tester has a probe card provided with a plurality of contact needles 3 to be touched to each of terminals 2 of the semiconductor memory 1. Each of the contact needles 3 is connected to each of a power supply terminal, a ground terminal, an address input terminal and a control signal input terminal in addition to input terminals $IO_0$ to $IO_n$ of the semiconductor memory 1 shown in FIG. 1.

FIG. 2 is a block diagram for showing a configuration of essential parts required for performing the pellet check of the semiconductor memory 1 shown in FIG. 1 of the constitution of the memory tester. This memory tester has a plurality of coaxial lines $5a$ to $5n$, and each one end of the coaxial lines $5a$ to $5n$ is connected to each of the contact needles 3 contacted to the input and output terminals $IO_5$ to $IO_n$ of the semiconductor memory 1. The other ends of the coaxial lines $5a$ to $5n$ are connected to the output terminals of each of the drivers $6a$ to $6n$ and one input terminal of each of comparators $7a$ to $7n$, respectively. To the other input terminals of the comparators are connected power supplies $8a$ to $8n$ for generating a reference voltage. Input terminals of the drivers $6a$ to $6n$ are connected to a data generating part 10. The output ends of the comparators $7a$ to $7n$ are connected to a discriminating part 11. The data generating part 10 and the discriminating part 11 are connected to a control part 12. In addition, although the memory tester is provided with a power supply voltage generating part or an address generating part or a control signal generating part in addition to the aforesaid configuration, these parts are eliminated for their illustration. Only the required number of coaxial lines $5a$ to $5n$, drivers $6a$ to $6n$ and comparators $7a$ to $7n$ for performing the pellet check of the semiconductor 1 are illustrated and actually it is possible that a greater number of parts than that shown can be applied.

Operation of the pellet check of the related art using the memory tester shown in FIG. 2 will be described as follows. At first, each of the contact needles 3 of the probe card is touched to its corresponding terminal of the semiconductor memory 1. Then, a predetermined address signal is given to the address input terminal of the semiconductor memory 1 through the contact needle 3 under a control of the control part 12, a control signal is given to the control signal input terminal of the semiconductor memory 1 and concurrently a desired data is generated by the data generating part 10 and given to the input and output terminals $IO_0$ to $IO_n$ of the semiconductor memory 1 through the drivers $6a$ to $6n$, the coaxial lines $5a$ to $5n$ and the contact needles 3 so as to write data into the memory cells in the semiconductor memory 1. Then, the data is read, the electrical potentials of the input and output terminals $IO_0$ to $IO_n$ of the semiconductor memory 1 are compared with a reference voltage by the comparators $7a$ to $7n$, thereby output data of the semiconductor memory 1 is reproduced and taken into the discriminating part 11. At the discriminating part 11, the written data and the readout data are discriminated for every input and output terminals $IO_0$ to $IO_n$ so as to discriminate whether the data is normal or not.

In this case, the number of concurrent measurement of chips during the pellet check may be substantially influenced by the number of comparators in the memory tester. In the case of the pellet check in the semiconductor memory of the related art, since the input and output terminals $IO_0$ to $IO_n$ of the semiconductor memory 1 and the comparators $7a$ to $7n$ of the memory tester strictly correspond to each other on a one-by-one basis, there is a problem that if the bit configuration of the semiconductor memory is increased, the number of concurrent measurements is decreased and the measuring cost is increased.

SUMMARY OF THE INVENTION

It is an object of the present invention to provide a semiconductor memory having a configuration of a plurality of bits, and more particularly a semiconductor memory in which the number of concurrent measurements in the pellet check can be increased and the measuring cost can be reduced.

The semiconductor memory of the present invention is comprised of a memory cell array having a plurality of memory cells of which addresses are determined in units of a plurality of bits; a writing and reading control means for writing data into or reading data from the memory cells in units of a plurality of bits; an address specifying means for specifying an address of the memory cell in which data is written or read by the writing or reading control means; a parity generating means for performing a parity calculation with all readout data of a plurality of bits constituting one unit and generating the parity bit; and a parity output means for outputting the parity bit generated by the parity bit generating means to an external part.

In addition, the semiconductor memory is comprised of a memory cell array having a plurality of memory cells of which addresses are determined in units of a plurality of bits; a writing and reading control means for writing data into or reading data from the memory cells in units of a plurality of bits; an address specifying means for specifying an address of the memory cell in which data is written or read by the writing or reading control means; a parity generating means for performing a parity calculation with all readout data of a plurality of bits constituting one unit and generating the parity bit; one bit testing input-output terminal for inputting the testing data from an external part and outputting the parity bit to the external part; a testing input-output means for giving the test data inputted from the testing input-output terminal during the writing operation to the memory cell of a plurality of bits constituting one unit and outputting the parity bit generated by the parity generating means during the reading operation to the testing input-output terminal; and a testing input-output control means for selectively operating the testing input-output means in response to the external testing control signal.

As a result of the aforesaid configuration, in the case of the semiconductor memory of the present invention, the parity generating means performs a parity calculation with all readout data of a plurality of bits constituting one unit to generate a parity bit and then the parity bit is outputted to the external part by the parity output means. In the case that the predetermined data is written into a plurality of bits constituting one unit, a value of the parity bit generated when the writing and reading of all the bits are normally carried out is made apparent in advance. Accordingly, if it is assumed that the value is an output expecting value, it would become possible to discriminate whether the plurality of bits are normal by discriminating whether the value of the parity bit actually generated coincides with the output expected value.

In addition, according to the semiconductor memory of the present invention, the parity generating means performs the parity calculation while applying all the readout data of a plurality of bits constituting one unit so as to generate a parity bit. The testing input-output control means selectively operates the testing input-output means in response to the testing control signal applied from an external part, the testing input-output means gives the testing data inputted from the testing input-output terminal during the writing operation against the memory cell of a plurality of bits constituting one unit and outputs the parity bit generated by the parity generating means during the reading operation to the testing input-output terminal. In the case that the predetermined testing data is written into the plurality of bits constituting one unit, the value of the parity bit generated when the writing and reading of all the bits are normally carried out is made apparent in advance. Accordingly, if the value is set as the output expected value, it becomes possible to discriminate whether the plurality of bits are normal by discriminating whether the value actually generated is coincided with the output expected value. In addition, since the inputting of the testing data and the outputting of the parity bit are carried out at the testing input-output terminal, it becomes possible to perform a pellet check if one contact needle for the data input-output in the memory tester is touched to the testing input-output terminal.

BRIEF DESCRIPTION OF THE DRAWINGS

FIG. 3 is a block diagram for showing a configuration of the semiconductor memory of the first preferred embodiment of the present invention.

FIG. 5 is a block diagram for showing a configuration of an essential part of the memory tester required for performing a pellet check for the semiconductor memory shown in FIG. 3 of the second preferred embodiment of the present invention.

DETAILED DESCRIPTION OF THE PREFERRED EMBODIMENTS

Figure 1:
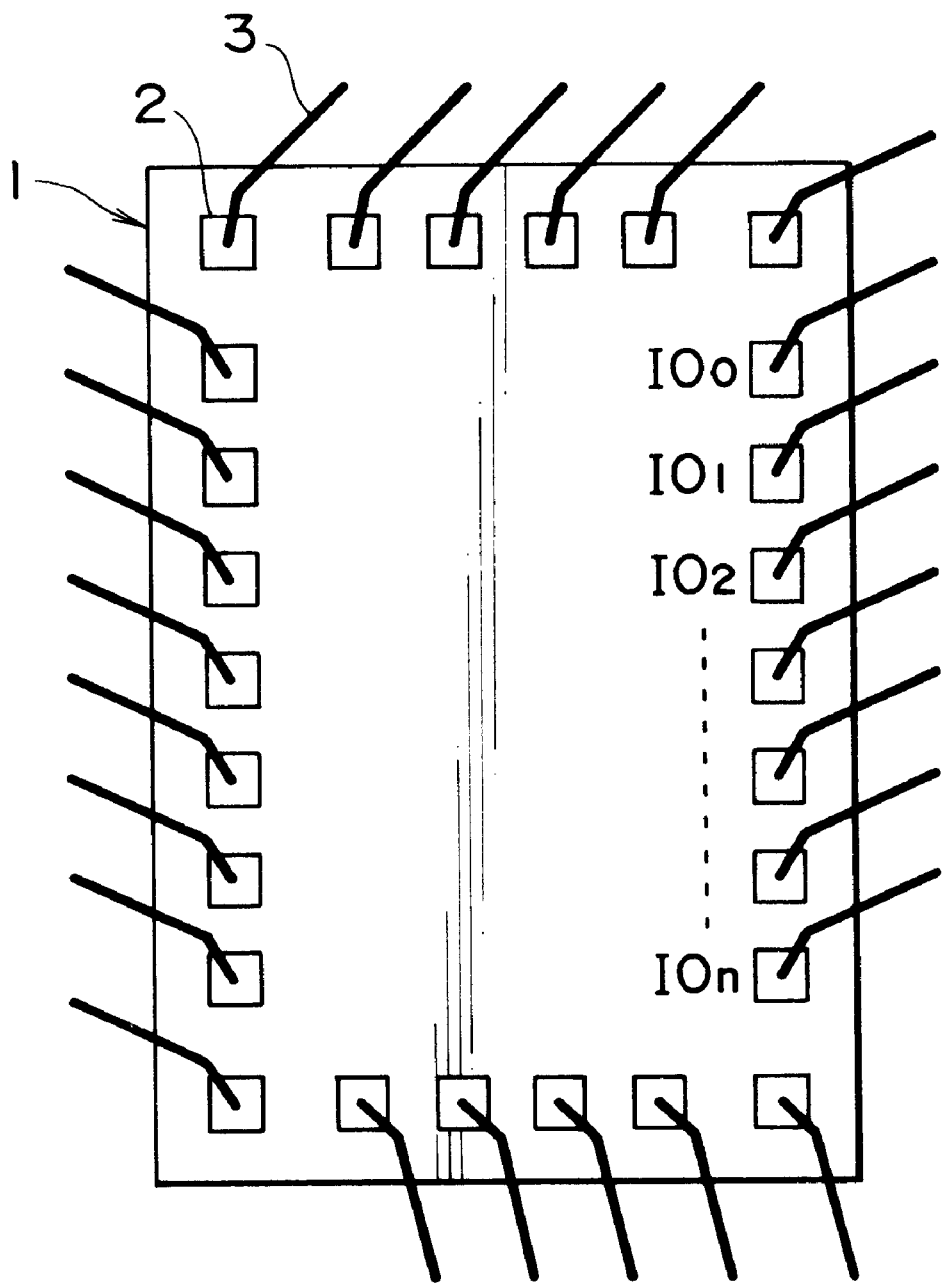
FIG. 1 is a top plan view for showing one chip of the semiconductor memory having a configuration of a plurality of bits in the related art.
Figure 2:
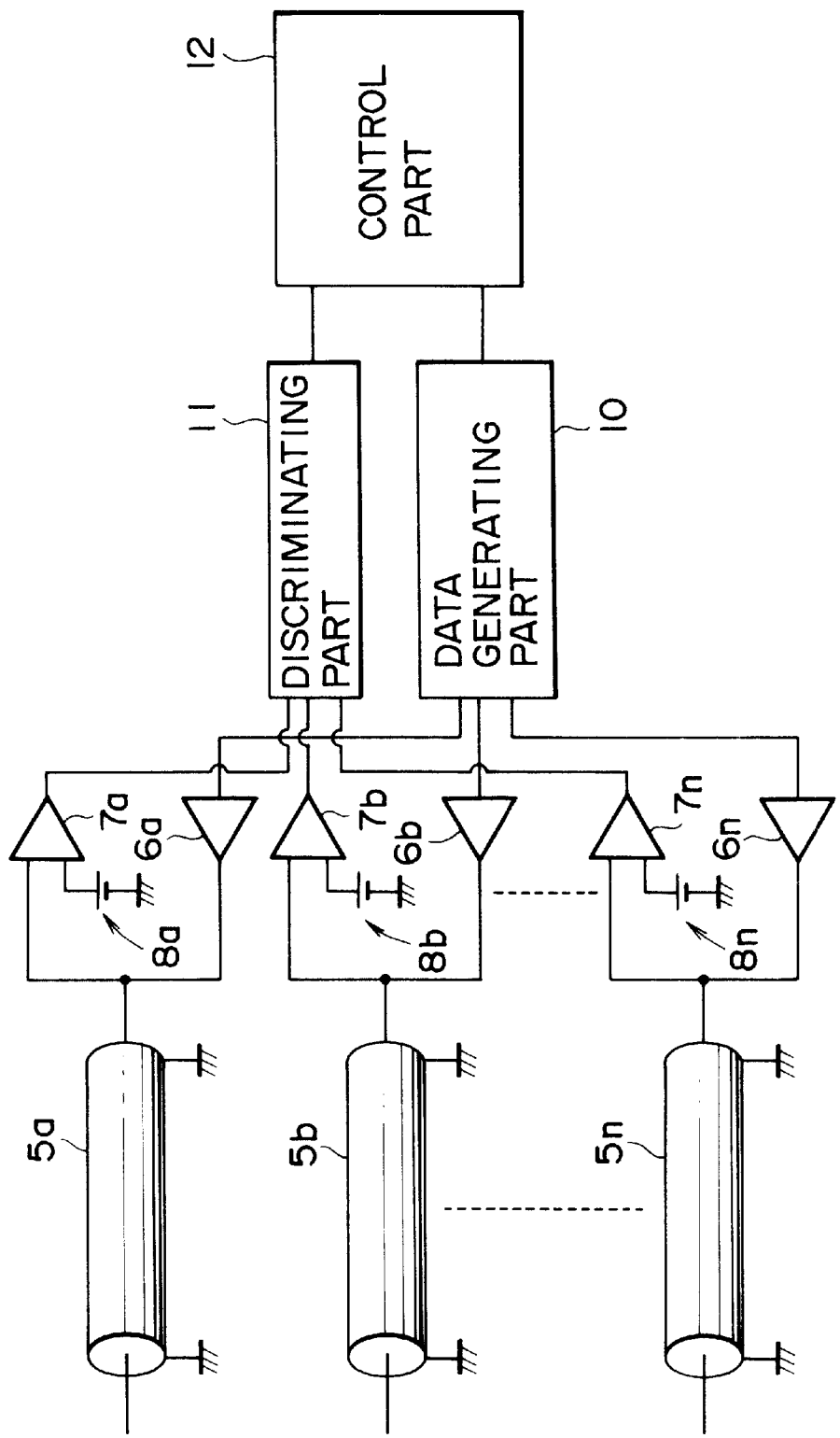
FIG. 2 is a block diagram for showing a configuration of an essential part required for the pellet check of the semiconductor memory shown in FIG. 1 of the configurations of the memory tester.

Referring now to the drawings, the preferred embodiments of the present invention will be described in detail as follows.

FIG. 3 is a block diagram for showing a configuration of the semiconductor memory of one preferred embodiment of the present invention. The semiconductor memory 20 of the preferred embodiment has a configuration of several bits for writing and reading data in units of a plurality of bits, wherein it is comprised of a memory cell array 21 having several cells of which addresses are determined in units of several bits; address input terminal 22; an address buffer 23 for use in latching address signals $A_0$ to $A_m$ inputted from the address input terminal 22; a row decoder 24 for decoding row addresses based on the address signals $A_0$ to Am latched by the address buffer 23 and selecting a word line in the memory cell array 21; a column decoder 25 for decoding a column address based on the address signals $A_0$ to $A_m$ latched by the address buffer 23 and selecting a bit line in the memory cell array 21; and a write driver 26 for use in sense amplifier data on the bit line and writing data (hereinafter referred to as a sense amplifier/write driver).

The semiconductor memory 20 is further comprised of data buses $DB_0$ to $DB_n$ connected to the sense amplifier/write driver 26; input-output terminals $IO_0$ to $IO_n$ for use in inputting or outputting data; an input-output circuit 27 for outputting data inputted from the input-output terminals $IO_0$ to $IO_n$ during a writing operation and outputting data on data buses $DB_0$ to $DB_n$ to the input-output terminals $IO_0$ to $IO_n$ during reading operation; control signal input-output terminals 28a to 28c for use in inputting a chip select signal bar CE, an output enable signal bar OE and a write enable signal bar WE; and a control circuit 29 for use in outputting control signals for the address buffer 23 and the sense amplifier/write driver 26, a write enable signal WE' for controlling the input-output circuit 27 and an output enable signal OE' in response to each of the signals inputted from the control signal input terminals 28a to 28c. The sense amplifier/write driver 26, the input-output circuit 27 and the control circuit 29 correspond to the writing and reading control means of the present invention and the row decoder 24 and the column decoder 25 correspond to the address specifying means of the present invention.

The semiconductor memory 20 is further comprised of a test circuit 30 for use in performing a pellet check. This test circuit 30 is comprised of a parity calculation circuit 31 acting as a parity generating means connected to the data buses $DB_0$ to $DB_n$ so as to perform a parity calculation with all readout data of several bits constituting one unit and to generate a parity bit; one bit testing input-output terminal 32 for inputting the test data from an external part and outputting the parity bit generated by the parity calculation circuit 31 to the external part; a test input-output circuit 33 for outputting the test data inputted from the test input-output terminal 32 during the writing operation to the data buses $DB_0$ to $DB_n$ while being divided into several bits constituting one unit and outputting the parity bit generated by the parity calculation circuit 31 during the reading operation to the test input-output terminal 32; a test control signal input terminal 34 for use in inputting the test control signal applied from the external part; and a test input-output control circuit 35 for selectively operating the test input-output circuit 33 in response to the test control signal inputted from the test control signal input terminal 34. The parity calculation circuit 31 performs either an exclusive OR calculation or a negative calculation of an exclusive OR for all readout data of several bits constituting one unit, wherein this circuit may be one in which it outputs a parity bit "1" when the number of bit "1" of all readout data is of an even number and it outputs a parity bit "0" when the number of bit "1" is of an odd number, and in turn the other in which it outputs a parity bit "0" when the number of bit "1" of all the readout data is of an even number, it outputs a parity bit "1" when the number of bit "1" is of an odd number.

The test input-output control circuit 35 is comprised of two AND gates 36 and 37 and an inverter 38. The test control signal input terminal 34 is connected to an input terminal of each of AND gates 36 and 37 and an input terminal of the inverter 38. The test control signal input terminal 34 is connected to a ground through between a source and a drain of an NMOS transistor 39 having a low current capability. A power supply voltage is applied to the gate of the transistor 39. To the other input end of AND gate 36 is applied a write enable signal WE' and to the other input terminal of AND gate 37 is applied an output enable signal OE' obtained from the control circuit 39. Each of the output ends of AND gates 36 and 37 is connected to the test input-output circuit 33.

The semiconductor memory 20 is comprised of two AND gates 41 and 42. To one input terminal of the AND gate 41 is applied a write enable signal WE' obtained from the control circuit 29 and to the other input terminal is applied an output signal of the inverter of the test input-output control circuit 35. To one input end of AND gate 42 is applied the output enable signal OE' obtained from the control circuit 29 and to the other input terminal is applied an output signal obtained from the inverter 38 of the test input-output control circuit 35. Each of the output terminals of AND gates 41 and 42 is connected to the input-output circuit 27.

Figure 4:
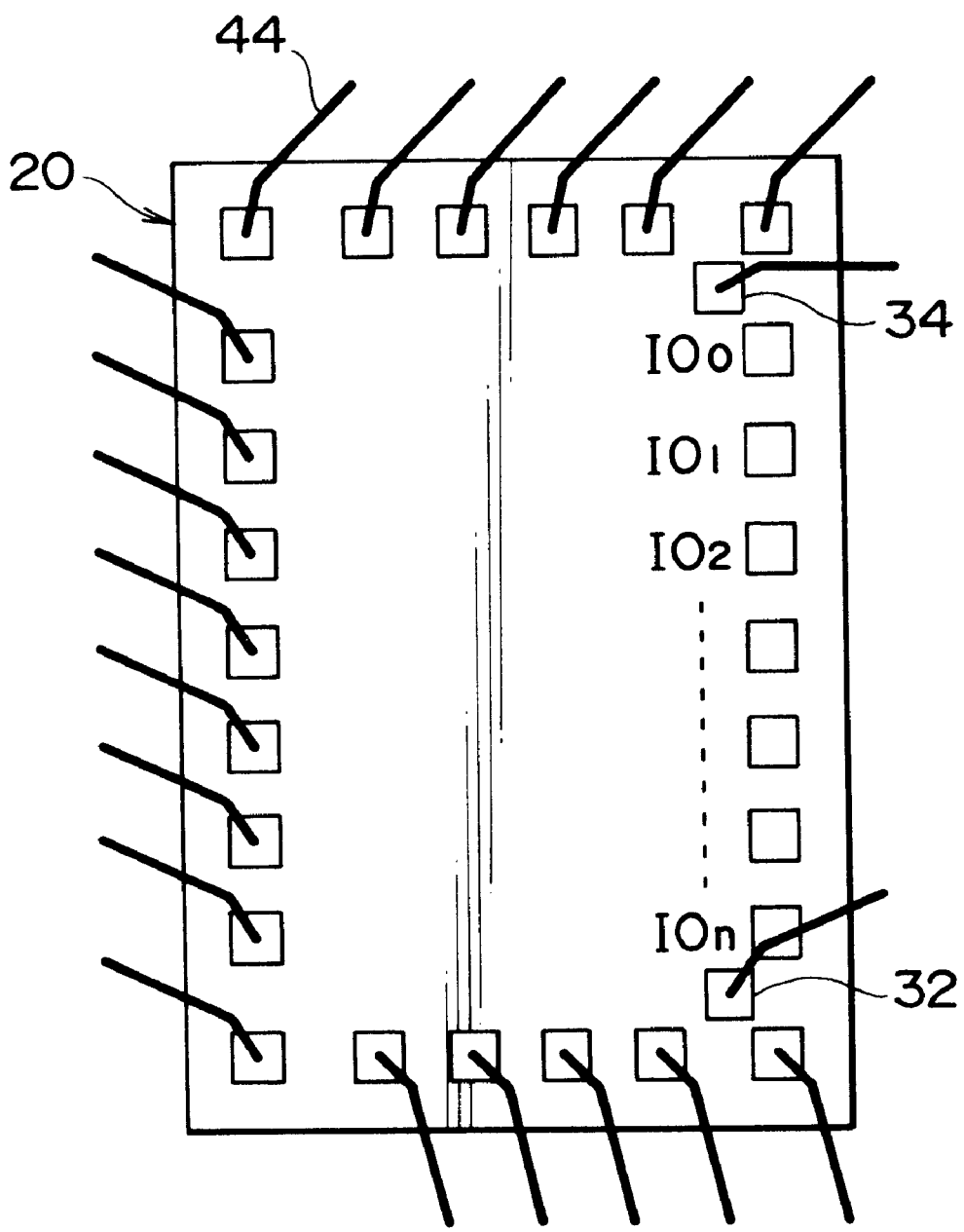
FIG. 4 is a top plan view for showing one chip of the semiconductor memory shown in FIG. 3.

FIG. 4 is a top plan view for showing one chip of the semiconductor memory 20 of the preferred embodiment. As shown in this figure, the semiconductor memory 20 of the preferred embodiment is comprised of a test input-output terminal 32 and a test control signal input terminal 34 in addition to the same terminals as those of the semiconductor memory 1 shown in FIG. 1. The memory tester for use in performing a pellet check of the semiconductor memory 20 of the preferred embodiment as a probe card having several contact needles 44 to be touched to the terminals of the semiconductor memory 20. In addition to the test input-output terminal 32 and the test control signal input terminal 34 of the semiconductor memory 20 shown in FIG. 4, each of the contact needles 44 is contacted to each of the power supply terminal, the ground terminal, the address input terminal and the control signal input terminal. However, in the preferred embodiment, there is no contact needle touched to the input-output terminals $IO_0$ to $IO_n$ of the semiconductor memory 20.

The second preferred embodiment of the present invention will be described as follows.

FIG. 5 is a block diagram for showing a configuration of an essential part of the pellet check of the semiconductor memory 20 of the preferred embodiment of the configurations of the memory tester. This memory tester has a coaxial line 61 and one end of the coaxial line 61 is connected to a contact needle 44 to be touched to the test input-output terminal 32 of the semiconductor memory 20. To the other end of the coaxial line 61 are connected an output terminal of a driver 62 and one input terminal of a comparator 63. To the other input terminal of the comparator 63 is connected the power supply 64 for generating a reference voltage. The input terminal of the driver 62 is connected to the data generating part 65. The output terminal of the comparator 63 is connected to the discriminating part 66. The data generating part 65 and the discriminating part 66 are connected to the control part 67. Although the memory tester is comprised of a power supply voltage generating part or an address generating part or a control signal generating part or a test control signal generating part in addition to the aforesaid configuration, these members are eliminated for their illustration. The coaxial line 61, the driver 62 and the comparator 63 which are only required for the pellet check of the semiconductor memory 20 of the preferred embodiment. Additionally members beyond those shown more than are also included.

Operation of the semiconductor memory of the preferred embodiment will be described as follows. Under a normal operating state, the test control signal input terminal 34 of the test circuit 30 is fixed at the ground level by a transistor 39. With such an arrangement as above, the outputs of AND gates 36 and 37 become "L" and the outputs of AND gates 41 and 42 become "H", the write enable signal WE' and the output enable signal OE' obtained from the control circuit 29 are provided to the input-output circuit 27, but are not provided to the test input-output circuit 33. Accordingly, it becomes possible to perform a normal data input-output operation through the input-output circuit 27.

During the pellet checking operation, at first, each of the contact needles 44 of the probe card of the memory tester is touched to each of the terminals of the semiconductor memory 20. Then, an electrical potential of "H" (a level VCC) is applied from the memory tester to the test control signal input terminal 34 of the test circuit 30. With such an arrangement as above, outputs of AND gates 36 and 37 become "H" and outputs of AND gates 41 and 42 become "L", resulting in that the write enable signal WE' and the output enable signal OE' obtained from the control circuit 29 are provided to the test input-output circuit 33, but is not provided to the input-output circuit 27. Accordingly, it becomes possible to perform a data input-output operation using the test input-output circuit 33.

Then, a predetermined address signal is given to the address input terminal 22 of the semiconductor memory 20 through the contact needle 44 under a control of the control part 67 of the memory tester, a control signal is given to the control signal input terminals 28a and 28c of the semiconductor memory 20 and concurrently a predetermined test data is generated by the data generating part 65, and is provided to the test input-output terminal 32 of the semiconductor memory 20 through the coaxial line 61 and the contact needle 44. The test input-output circuit 33 holds the test data inputted from the test input-output terminal 32 while being divided into a plurality of bits constituting one unit during the writing operation corresponding to the write enable signal WE' and outputs the data to the data buses $DB_0$ to $DB_n$. With such an arrangement as above, the same test data is written into the memory cells of a plurality of bits of specified address.

Then, during the reading operation corresponding to the output enable signal OE', the parity calculation circuit 31 performs a parity calculation using all the readout data of a plurality of bits constituting one unit, generates a parity bit and in turn the test input-output circuit 33 outputs a parity bit generated by the parity calculation circuit 31 to the test input-output terminal 32. The memory tester regenerates a value of the parity bit by comparing an electrical potential of the test input-output terminal 32 with a reference voltage by the comparator 63 and inputs it into a discriminating part 66. At the discriminating part 66, a value of the parity bit is discriminated whether the value coincides with an output expected value so as to discriminate whether it is normal. That is, in the case that the predetermined test data is written into a plurality of bits constituting one unit, the value of parity bit generated when the writing and the reading of all the bits are normally carried out is made apparent in advance. Accordingly, if it is assumed that the value is applied as the output expected value, it is discriminated whether the value of the parity bit actually generated coincides with the output expected value, it becomes possible to determine whether a plurality of bits are normal.

As described above, the preferred embodiment of the present invention is operated such that the test data inputted from the test input-output terminal 32 of one bit during the pellet checking operation is written into the memory cell of a plurality of bits constituting one unit, the parity calculation is carried out through the parity calculation circuit 31 with all the readout data so as to generate a parity bit, this parity bit is outputted from the test input-output terminal 32, and at the memory tester side, it is determined whether the value of the parity bit coincides with the output expected value, thereby it is determined whether a plurality of bits are normal. Accordingly, since it is sufficient that only one comparator be used in the memory tester to perform the pellet checking of one semiconductor memory 20 constituting a configuration of a plurality of bits, it is possible to increase the number of concurrent measurements and to reduce a measuring cost.

In addition, in the preferred embodiment, since the normal state is determined using the parity bit, if the error states occur in more than 2 such errors cannot be detected and a rate of sensing decreases as compared with that of the normal testing method. However, no problem occurs in the case that the semiconductor memory is manufactured with a stable process where such errors of more than 2 bits are scarcely produced.

In addition, in the present preferred embodiment, since no input-output circuit 27 is applied during the pellet checking operation, some tests for the input-output circuit 27 such as the output leak current test and the output current test or the like cannot be carried out, although other basic pellet checking such as a power supply current test, a writing test and a reading test or the like are not prohibited.

The present invention is not limited to the aforesaid preferred embodiments and for example, in the preferred embodiment, one test data is divided into some items, the same test data is written into the memory cell having a plurality of bits, although it is also possible that the test data can be changed for every one bit if a serial-parallel converter circuit is arranged within the test input-output circuit 33 so as to generate parallel data by serial-parallel converting of the test data inputted in series from the test input-output terminal 32 in which the generated parallel data is written into the memory cell having a plurality of bits.

As described above, according to the semiconductor memory of the present invention, since it is operated such that the parity calculation is carried out with all the readout data having a plurality of bits constituting one unit under an operation of the parity generating means and this parity bit is outputted to an external part by the parity output means, the value of parity bit, generated when the desired data is written into a plurality of bits constituting one unit to perform normal writing and reading of all the bits, is applied as an output expected value and it is determined whether the value of the actually generated parity bit coincides with the output expected value so as to enable it to be determined whether a plurality of bits are normal, resulting in that the present invention provides some effects that the number of concurrent measurements during the pellet checking operation can be increased and the measuring cost can be reduced.

In addition, according to the semiconductor memory of the present invention, inputting of the test data and outputting of parity bit are carried out by the test input-output terminal having one bit, so that in addition to the aforesaid effects, the present invention has an effect that a pellet checking can be carried out if one contact needle for data inputting or outputting in the memory tester is touched to the test input-output terminal.

What is claimed is:

1. A semiconductor memory comprising:
a memory cell array having a plurality of memory cells of which addresses are determined in units of a plurality of bits;
writing and reading control means for writing data into and reading data from the memory cells in units of a plurality of bits;
address specifying means for specifying an address of the memory cell in which data is written or read by the writing and reading control means;
parity generating means for performing a parity calculation with all readout data of a plurality of bits constituting one unit and for generating a resulting parity bit; and
parity output means for outputting the parity bit generated by the parity bit generating means to an external physically separate part; said parity output means including a single make/break electrical contact terminal which provides the parity bit to the external part, the external part including means for comparing the parity bit with a predetermined parity value of the readout data in order to detect an error in said memory cell array.

2. A semiconductor memory comprising:
a memory cell array having a plurality of memory cells of which addresses are determined in units of a plurality of bits;
writing and reading control means for writing data into and reading data from the memory cells in units of a plurality of bits;
address specifying means for specifying an address of the memory cell in which data is written or read by the writing and reading control means;
parity generating means for performing a parity calculation with all readout data of a plurality of bits constituting one unit and for generating a resulting parity bit;
one bit testing input-output make/break contact electrical terminal for inputting test data from a physically separate external part and outputting the parity bit to the external part;
testing input-output means for providing the test data inputted from the testing input-output terminal during a writing operation to the memory cell of a plurality of bits constituting one unit and outputting the parity bit generated by the parity generating means during a reading operation to the testing input-output terminal; and
testing input-output control means for selectively operating the testing input-output means in response to an external testing control signal.

3. A semiconductor memory as set forth in claim 2 in which said testing input-output means is provided with a serial-parallel conversion circuit and the test data is converted bit by bit.

4. A semiconductor memory as set forth in claim 2 in which a pellet having said memory cells formed therein is checked with said parity generating means and the testing input-output means.

5. A semiconductor memory comprising:
a memory cell array having a plurality of memory cells, each of the memory cells being associated with a multibit address;
writing and reading control means for controlling writing data into and reading data from the memory cells in a multibit, parallel format;

decoder means for decoding said multibit address and for selecting a corresponding word line and a corresponding bit line to read or write data in response to said writing and reading control means;

data input-output means coupled to said writing and reading control means for receiving data from and providing data to said memory cell array; and a test circuit that includes: a test input-output make/break electrical contact terminal; a test input-output circuit that receives test bits in serial from said test input-output terminal and provides said test bits in parallel to said data input-output means; and a parity calculation circuit coupled to said data input-output means, wherein the parity calculation circuit determines parity of the test bits as they are read out from the memory cell array via the data input-output means and outputs a parity bit indicative of parity of the test bits, the parity bit being provided to said test input-output make/break electrical contact terminal.

6. The semiconductor memory according to claim 5, further comprising a control circuit, said data input-output means reading or writing data in response to control signals received from said control circuit.

7. The semiconductor memory according to claim 6, wherein said data input-output means includes a sense amplifier/write driver circuit.

8. The semiconductor memory according to claim 7, further comprising an input-output circuit coupled to a plurality of input-output terminals, said input-output circuit selectively providing data to and from said data input-output means and said plurality of input-output terminals in response to said control signals received from said control circuit.

9. The semiconductor memory according to claim 8, further comprising a test input-output control circuit which selectively controls said test input-output circuit in response to said control signals from said control circuit and a test control signal received from a test control signal input terminal, wherein said semiconductor memory is operable in two states: a standard state in which data is inputted into and outputted from said memory cell array via said input-output terminals, and a test state in which test data is read into said memory cell array and said parity bit is inputted into said memory cell array and said parity bit is outputted from said test circuit.

10. The semiconductor memory according to claim 9, wherein in said test state said test data is provided from a data generating part of an external device and said parity bit is compared with a reference voltage by a discriminating part of the external device.

* * * * *